US008567256B2

(12) United States Patent
Albicker et al.

(10) Patent No.: US 8,567,256 B2
(45) Date of Patent: Oct. 29, 2013

(54) PRESSURE SENSOR HAVING A PIEZORESISTIVE SENSOR CHIP ELEMENT

(75) Inventors: Ulrich Albicker, Lauchringen (DE); Christof Sonderegger, Neftenbach (CH); Peter Meister, Neftenbach (CH); Jochen Von Berg, Neftenbach (CH); Rene Tanner, Seuzach (CH); Jeffrey M. Schnellinger, Akron, NY (US)

(73) Assignee: Kistler Holding, AG, Winterthur (CH)

( * ) Notice: Subject to any disclaimer, the term of this patent is extended or adjusted under 35 U.S.C. 154(b) by 0 days.

(21) Appl. No.: 13/819,450

(22) PCT Filed: Aug. 29, 2011

(86) PCT No.: PCT/CH2011/000196
§ 371 (c)(1),
(2), (4) Date: Feb. 27, 2013

(87) PCT Pub. No.: WO2012/027853
PCT Pub. Date: Mar. 8, 2012

(65) Prior Publication Data
US 2013/0167650 A1    Jul. 4, 2013

Related U.S. Application Data

(60) Provisional application No. 61/379,072, filed on Sep. 1, 2010.

(30) Foreign Application Priority Data

Sep. 13, 2010   (CH) ...................................... 1462/10

(51) Int. Cl.
*G01L 9/06*   (2006.01)

(52) U.S. Cl.
USPC ............................................... 73/727; 73/700

(58) Field of Classification Search
None
See application file for complete search history.

(56) References Cited

U.S. PATENT DOCUMENTS

| | | | | |
|---|---|---|---|---|
| 4,993,265 A | * | 2/1991 | Koen et al. ...................... | 73/706 |
| 5,333,505 A | * | 8/1994 | Takahashi et al. ............... | 73/727 |
| 5,412,992 A | * | 5/1995 | Tobita et al. .................... | 73/721 |

(Continued)

FOREIGN PATENT DOCUMENTS

| EP | 1584911 A1 | 10/2005 |
|---|---|---|
| JP | 61226627 A | 10/1986 |

OTHER PUBLICATIONS

International Search Report, issued Oct. 21, 2011.

*Primary Examiner* — Lisa Caputo
*Assistant Examiner* — Jermaine Jenkins
(74) *Attorney, Agent, or Firm* — Dority & Manning, P.A.

(57) ABSTRACT

A piezoresistive sensor chip element of a pressure sensor has lower face with an outer edge, an adhesion area and a non-adhesion area. The chip has a closed chip cavity for measuring the pressure of a medium flowing around the chip. The upper face of a substrate is fastened only at the adhesion area of the chip. The non-adhesion area extends at least over a circular area arranged centrally on the lower face and covers a third of the lower face's total area and extends over at least one connection area from the circular area to the edge of the lower face. The pressure in the pressure medium can spread through the connection area into a space under the non-adhesion area on the element lower face. The substrate has a recess located centrally under the sensor chip element.

12 Claims, 3 Drawing Sheets

(56) References Cited

U.S. PATENT DOCUMENTS

| | | | |
|---|---|---|---|
| 5,852,320 A * | 12/1998 | Ichihashi | 257/419 |
| 6,543,292 B1 | 4/2003 | Colton et al. | |
| 6,591,689 B2 * | 7/2003 | Nidan et al. | 73/754 |
| 6,871,546 B2 * | 3/2005 | Scheurich et al. | 73/754 |
| 7,265,477 B2 * | 9/2007 | Wan | 310/309 |
| 7,429,495 B2 * | 9/2008 | Wan | 438/53 |
| 7,743,663 B2 * | 6/2010 | Von Berg et al. | 73/727 |

\* cited by examiner

PRESSURE SENSOR HAVING A PIEZORESISTIVE SENSOR CHIP ELEMENT

CROSS-REFERENCE TO RELATED APPLICATIONS

This application claims priority to International Application Serial No. PCT/CH2011/000196, filed Aug. 29, 2011, which claims priority to Swiss Application No. CH 1462/10 filed Sep. 13, 2010. International Application Serial No. PCT/CH2011/000196 is hereby incorporated herein in its entirety for all purposes by this reference.

FIELD OF THE INVENTION

The invention relates to a pressure sensor having a closed chip cavity, comprising a piezoresistive sensor chip element for measuring the pressure of a pressure medium flowing around the chip with an element lower face, and a substrate with a substrate upper face, to which the sensor chip element is fastened at the lower face thereof, wherein said lower face comprises an adhesion area and has an outer edge, and wherein the lower face adheres to the substrate upper face in the adhesion area.

BACKGROUND

Piezoresistive pressure sensors differ from other such sensors, particularly from piezoelectric pressure sensors, in that they are able to measure pressures reliably over very long periods of time. Piezoelectric pressure sensors need to be "reset" in order to be made ready to start taking measurements again, because over time they lose their charge and "drift".

Examples of absolute pressure sensors are piezoresistive sensors, particularly oil-filled piezoresistive pressure sensors. These comprise a sensor chip element that is placed on a substrate or on a passthrough. As a rule, this is attached with an adhesive. Finally, oil is passed round the sensor chip element under a membrane. If a pressure is applied outside of the membrane, the oil under the membrane is also subjected to pressure. The sensor chip under pressure generates a corresponding signal, which is finally forwarded to an evaluation unit via two more contacts with connecting wires. It is quite possible that such sensor may also be constructed without membranes. The sensor chip is then exposed to the external pressure medium directly.

It has been discovered that over time, signal drift also occurs with the sensors described here. This means that the pressure indicated changes slightly with time for the same load. This drift is of a much smaller order than occurs with piezoelectric pressure sensors, because it has a different physical cause. Piezoelectric elements lose their charges over time, piezoresistive elements do not. The drift in piezoresistive pressure sensors is in the order of about 0.1%.

The pressure is exerted evenly on the surface of the substrate or the passthrough on which the sensor chip element is positioned centrally. Particularly under high pressure of more than 50 bar, the passthrough sags somewhat, so that a small recess is created under the middle of the sensor chip element. It has been discovered that after a period the adhesive between the passthrough and the sensor chip element creeps inwards to fill this recess. Moreover, the adhesive may also be buckled by the pressure in the edge area of the sensor chip element and the substrate, causing the sensor chip element to be deformed. After some time, the creep of the adhesive compensates for this buckling. This results in signal drift, because the conditions of counterpressure from below the sensor chip element vary over time.

In order to correct this problem, in some cases the adhesive was dispensed with. Then, the sensor chip element was attached only by the contacts. However, these contacts were sometimes destroyed by vibrations and the sensor was unable to transmit any measurement values.

A rectangular sensor chip element that is fastened to a substrate with a drop of adhesive at each of the four lower corners is known from U.S. Pat. No. 6,543,292. This is intended to prevent thermal tensions between the substrate and the chip. However, it has been discovered that the capillary effect in the gap between the sensor chip element lower face and the substrate upper face causes the adhesive to disperse in this gap, either as it is being applied, or during subsequent use. This can cause the adhesive to spread over a large area of the gap, in some cases over the entire area of the gap. The sizes of the surfaces covered by the adhesive drops cannot be checked. The problem of signal drift described earlier is thus not eliminated; the sensor chip elements can be buckled in this application as well.

Assembly is difficult even when highly viscous adhesives exhibiting hardly any capillary effect are used. The pressure with which sensor chip element 2 is positioned on the adhesive cannot be controlled completely. Thus, the adhesive is squeezed under element 2 in uncontrolled manner, and it is not possible to determine how far the adhesion area reaches towards the middle of element 5.

Apart from the absolute pressure sensors to which this invention relates, differential pressure sensors are also known. Unlike the absolute pressure sensors, the chip cavity in the differential pressure sensors is not closed, but it is in a pressure connection with a second pressure medium. Since the element calculates the differential pressure between the ambient pressure and the cavity pressure, the substrate itself is not exposed to a load. Such an example is described in JP 61-226627. The element is attached with terminals, which hold it in place by spring force. Since no adhesive is used, the element is also not buckled.

FIG. 1 is a diagrammatic representation of a pressure sensor 1 according to the prior art. A piezoresistive sensor chip element 2 is located in a housing 12 and is attached by the element lower face 5 thereof to a substrate 6. In this variation, sensor chip element 2 comprises a piezoresistive chip 3 on a block-shaped chip base 4. A chip cavity 27 is included between said chip 3 and base 4. Chip 3 measures the respective pressure difference between the reference pressure in chip cavity 27 and external pressure acting on chip 3. A pressure medium 14 flows around sensor chip element 2 on all sides except the underside 5 thereof and by exerting a pressure generates a measurement signal that is forwarded by contacts 25. Said contacts pass through substrate 6, which in this case is designed as a passthrough. An insulating element 11 provides a seal for the pressure chamber filled with pressure medium 14. Finally, the measurement signals are processed in an evaluation unit not shown here.

In this embodiment, housing 1 is closed off from pressure chamber 26 by a membrane 13. In this way, contacts 25 and sensor chip element 2 are protected against mechanical and chemical influences from pressure chamber 26. In these variations, the space around sensor chip element 2 is usually filled with the oil pressure medium 14, which is always under the same pressure as pressure chamber 26 due to the soft membrane 13. Other, equivalent variations do not have a membrane 13. Consequently, sensor chip element 2 is in direct contact with the pressure medium 14 of pressure chamber 26.

Sensor chip element 2 has an element lower face 5, which is located opposite chip 3 on chip base 4. This element lower face 5 is positioned on face 7 of substrate 6, which faces towards pressure chamber 26. In this embodiment according to the prior art, adhesion area 8, by which sensor chip element 2 is fastened to substrate 6, occupies the entire surface area of element lower face 5. An adhesive mass 24 is usually used to ensure adhesion.

FIG. 2 represents a cross section of a known sensor chip element 2 according to FIG. 1 on a substrate 6. Adhesive substance 24 is applied evenly between the element lower face and the substrate upper face. This FIG. 2 represents an arrangement without pressure loading.

FIGS. 3a and 3b shows the same prior art sensor chip element 2 of FIG. 2 under pressure load at the time the pressure is applied (FIG. 3a) and a long time later (FIG. 3b). Since the present invention relates to long-duration pressure sensors that are able to take measurements reliably for many months or years without requiring a "Reset", the time difference between such two representations may be correspondingly long.

The arrows around sensor chip element 2 in FIGS. 3a and 3b show the pressure load from pressure medium 14 that is acting thereon. In both FIGS. 3a and 3b, substrate 6 sags under the applied pressure, resulting in a curvature of substrate upper face 7.

In FIG. 3a, when the pressure is first applied, the pressure load on element lower face 5 is lower in the centre because adhesive substance 24 draws this area toward substrate upper face 7. Accordingly, the sensor chip element is slightly deformed, which results in a slight increase in the measured value calculated by chip 3. A dashed line on the chip is an exaggerated representation of this sagging.

The pressure also acts laterally on adhesive substance 24. In combination with the negative pressure created centrally below element lower face 5, over time adhesive substance 24 slowly creeps towards the centre, as is shown in FIG. 3b. This causes the pressure on element lower face 5 to change, and therewith also the measurement signal, even though the pressure is unchanged. The pressure on sensor chip element 2 is reduced, and the element tends towards the shape it had before pressure was applied as in FIG. 3. The arrows of equal length along a cross section of the sensor chip element indicate this correspondingly.

However, as soon as the pressure in the pressure chamber falls to the ambient pressure and the substrate regains its former shape, the adhesive, which has meanwhile accumulated in the centre, exerts increased pressure on the sensor chip element, thereby generating a false signal, which leads to the incorrect conclusion that pressure has increased in the pressure chamber.

BRIEF SUMMARY OF THE INVENTION

The object of the invention is therefore to describe a novel means for fastening the sensor chip element in a piezoresistive pressure sensor of the type described in the preceding, that does not cause signal drift and does not place any additional load on the contacts in the event of vibrations.

This object is solved by the features of the independent claim. The dependent claims describe particularly advantageous embodiments of the invention.

The invention thus relates to a pressure sensor of the type described in the introduction, wherein the element lower face has a non-adhesion area, and wherein the lower face does not adhere to the substrate upper face in the non-adhesion area. The non-adhesion area extends at least over a circular area arranged centrally on the lower face, said circular area comprising a third of the total area of the element lower face. The non-adhesion area also comprises at least one connecting area from this central surface to the edge of the lower face. In this way, the pressure in the pressure medium is able to spread through the communication area into a space below the non-adhesion area on the element lower face.

According to the invention, the substrate of the pressure sensor has a recess arranged centrally below the sensor chip element. Such a recess may be provided easily in the form of a drillhole. This ensures that the adhesion area occupies at most the area of the substrate upper face that is not located opposite this recess. The non-adhesion area correspondingly occupies at least the area of the recess that is located opposite the element lower face. It thus forms at least the common face of the recess and the element lower face.

The adhesive is not able to spread to the central area of the lower face of the sensor chip elements due to capillary attraction because the distance from the substrate upper face is too great for this as a consequence of the recess area.

The recess should extend at least over a circular area located centrally on the lower face, which circular area occupies a third of the total surface area of the element lower face. In addition, the recess should also comprise at least a communication area from the circular area beyond the edge of the lower face, so that the pressure in the pressure medium is able to spread through the communication area into a space below the non-adhesion area on the element lower face.

Since the recess extends beyond the edge of the lower face in at least one location, a kind of tunnel is created through which the pressure medium is always able to reach the central area of the element lower face.

With this arrangement, it is possible for the pressure to act on the sensor chip element evenly from all directions, including from below. However, the critical feature is that the adhesion area is not located in the central area of the sensor chip element. It was discovered that a central connection between the substrate and the sensor chip element may cause a deformation of the sensor chip element if the substrate itself sags under the effect of the application of high pressure. Such a deformation is not a problem per se, since this is also effective when the pressure sensor is calibrated.

However, after a long period of time under constantly high pressure the central connection begins to lose its tensioning force because as a rule the adhesion gradually diminishes. Consequently, the sensor chip element slowly loses its shape and reverts to its original shape, which is reflected incorrectly as a change in pressure in the data output from the measurement element.

The attachment according to the invention of the sensor chip element to the substrate ensures that the sensor chip element retains its original shape permanently and is not deformed by deformation of the upper face of the substrate itself. The adhesion area, which occupies less than two thirds, preferably less than one third of the total lower face of the sensor chip element, is located on the edge of said element. This is the least affected by sagging of the substrate and therefore does not cause any additional sagging of the sensor chip element. The space between the non-adhesion area of the sensor chip element and the substrate is in a pressure exchange relationship with the pressure chamber via the communication area, thereby ensuring that the force acting on the lower face of the sensor chip element remains constant. Due to its attachment at the edge, the sensor chip element is positioned in such manner that it has a highly resistant force with respect to vibrations.

It was discovered that the signal drift of about 0.1% in conventional variations is reduced by a factor of about ten by the adhesion arrangement according to the invention.

BRIEF DESCRIPTION OF THE DRAWINGS

In the following, the invention will be explained in greater detail with reference to the drawings. The figures represent diagrammatically.

DESCRIPTION OF EXEMPLARY EMBODIMENTS OF THE INVENTION

All reference signs have the same meaning in all of the figures.

Figure 4A:
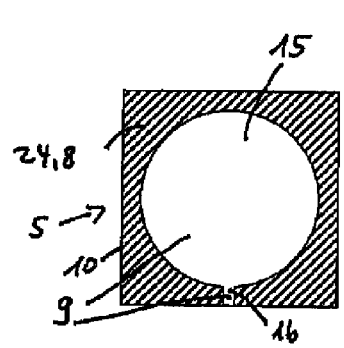
FIG. 4a a sensor chip adhesion arrangement according to the invention on the lower face of a sensor chip element.

In the variations of the pressure sensor according to the invention, element lower face 5 is not attached to substrate 6 by its entire surface, but only in an area that excludes the central area. FIG. 4a shows an element lower face 5 having an outer edge 10. This element lower face 5 inside edge 10 is divided into an adhesion area 8 marked with diagonal lines, and a non-adhesion area 9, which is unmarked. Element lower face 5 must not adhere to substrate 6 at all at any point in non-adhesion area 9, but it does not have to adhere to substrate 6 at all points of the adhesion area either. Adhesion must be assured within adhesion area 8, but this does not have to occupy the entire area.

According to the invention, a recess 20 is provided in the centre of substrate 6. This ensures that non-adhesion area 9 is not filled with adhesive by capillary attraction during assembly. Excess adhesive that may have been applied is able to flow off into recess 20 without causing adhesion in non-adhesion area 9.

According to the invention, non-adhesion area 9 occupies at least a third, preferably at least half of element lower face 5, which defines a centrally located circular area 15. Non-adhesion area 9 also comprises at least one communication area 16 between this circular surface 15 and the edge 10 of element lower face 5. This ensure that the pressure in pressure medium 14 is able to spread through the communication area 16 in non-adhesion area 9, particularly into the space beside the centrally positioned circular surface 15 on element lower face 5.

Figure 5:
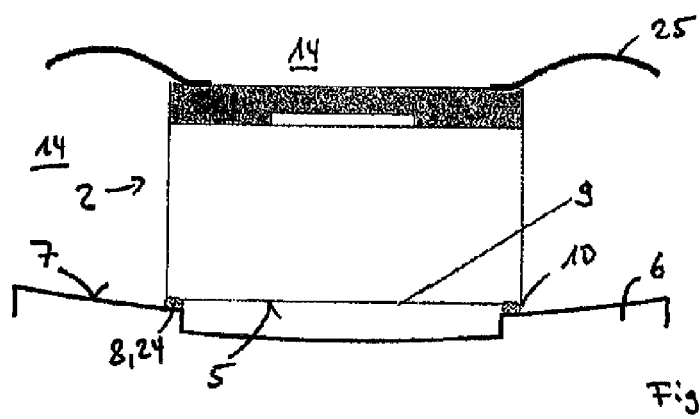
FIG. 5 a sensor chip element on a substrate with a sensor chip adhesion arrangement according to the invention under pressure load.

The forces that are still able to act on sensor chip element 2 from adhesion areas 8 in this variation are shown in FIG. 5. FIG. 5 shows a cross section through a sensor chip element 2 according to the invention under pressure loading. The curvature of substrate 6 is significantly exaggerated for the sake of clarity. Since adhesion areas 8 are only located close to edge 10 and are absent from the central area, and since the pressure from the inside, that is to say from the centre also acts on the connections in adhesion area 8, there are hardly any forces acting on sensor chip element 2, which in turn means that the element is barely deformed at all. Accordingly, these negligible forces hardly differ at all from the time when pressure is first applied, even after long periods, so the measurement signal also does not change even after a long period.

The essential feature is that non-adhesion area 9 extends over a circular area 15 located centrally on element lower face 5, this circular area occupying at least a third of the total surface area of element lower face 5. This ensures that if substrate upper face 7 sags the additional forces transmitted to sensor chip element 2 via adhesion area 8 are minimal.

It is also important that pressure medium 14 has at least one channel of access to the centrally located circular area 15 via a communicating area 16, so that the pressure can be exerted from all sides.

Figure 4B:
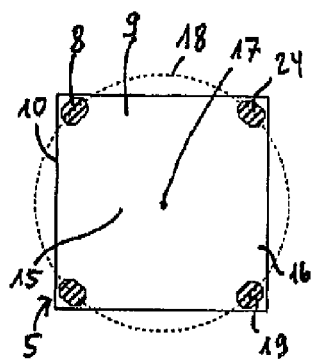
FIG. 4b an alternative sensor chip adhesion arrangement according to the invention on the lower face of a sensor chip element.

FIG. 4b shows a further arrangement according to the invention of adhesion area 8. According to the invention, adhesive substance 24 should be applied essentially along a circular line 18, which is concentric with a sensor axis 17. Since the deformations along such circular lines 18 are equal at all points, the forces acting on adhesive substance 24 are also the same in these areas. The farther towards the outside the adhesion areas 8 are located, the lower the forces become. Adhesion area 8 preferably consists of discrete points or discrete segments, so that at least one connection with non-adhesion area 9 is assured at all times.

Figure 4C:
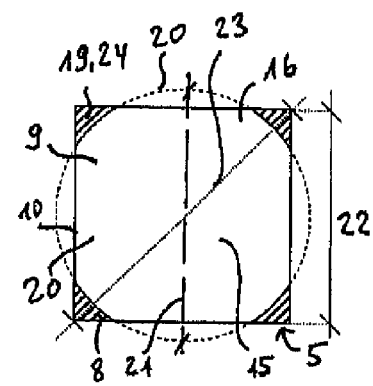
FIG. 4c another alternative sensor chip adhesion arrangement according to the invention on the lower face of a sensor chip element.

Since sensor chip element 2 is usually rectangular in shape, it is advantageous to apply adhesion area 8 to corner points 19 of element lower face 5, as is shown in FIGS. 4b and 4c. Adhesion area 8 should advantageously occupy less than 20%, preferably less than 5% of element lower face 5 in total. It has been discovered that this is entirely sufficient to assure adequate adhesion between substrate 6 and sensor chip element 2.

Originally, pressure sensor 1 according to the invention was designed for applications involving very high pressures, particularly pressures above 50 bar. Typical application fields include oceanography, oil and gas extraction, as well as gas delivery. However, it has been shown that pressure sensors in the range from 1-5 bar exhibit significant improvements when pressure sensor 1 is of a design according to the invention.

Figure 6:
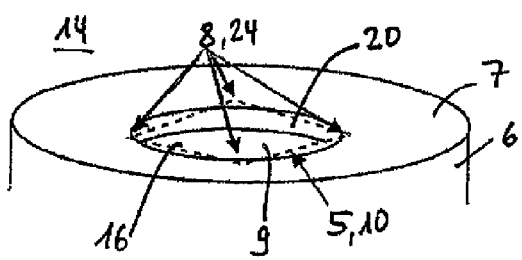
FIG. 6 a perspective view of a substrate with indication of the sensor chip adhesion arrangement according to the invention.

Pressure sensor 1 according to the invention is particularly advantageous when recess 20 is circular in shape and located centrally below the usually rectangular sensor chip element, as is shown in the perspective view of FIG. 6. Such a recess 20 may easily be made in the form of a drillhole. According to the invention, in this case diameter 21 of recess 20 is greater than an edge length 22 and less than a diagonal 23 of the rectangular element lower face 5. This ensures that a communicating area 16 is always present, and provides a pressure communication with non-adhesion area 9, as is shown in FIG. 4c and FIG. 5.

It follows that non-adhesion area 9 is the common surface area of round recess 20 and rectangular element lower face 5. This is shown in FIG. 4c. The adhesion area extends over corners 19 of the rectangular element lower face 5, which are outside of drillhole 20. A suitable adhesive 24 may be applied to the entire surface or topically to element lower face 5 or to the substrate before sensor chip element 2 is mounted on substrate 6. The essential non-adhesion area and access to the sensor chip element lower face 5 by pressure medium 14 are both assured by the presence of recess 20.

Sensor chip element 2 preferably adheres to substrate 6 by virtue of an adhesive substance 24. An adhesive substance 24 represents a medium that ensures adhesion on both surfaces. It has been found that soft, elastic adhesives 24 deliver better results than hard adhesives. Particularly adhesive substances 24 that are able to sustain linear extension of at least 100%, preferably of 200% transmit lower forces and are therefore preferable to other, rigid adhesive substances 24. This is because the adhesive substances are usually applied in very thin layers. Tangential shifts are therefore possible even with very thin layers.

Figure 1:
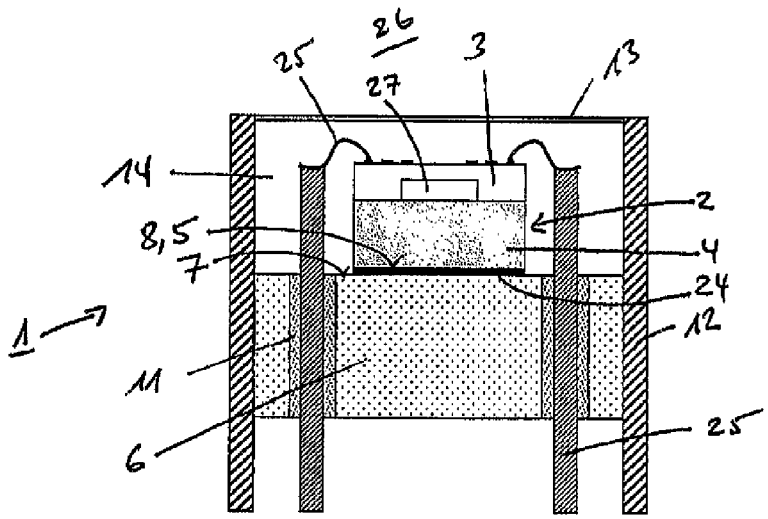
FIG. 1 a cross section through an oil-filled piezoresistive pressure sensor according to the prior art.
Figure 7:
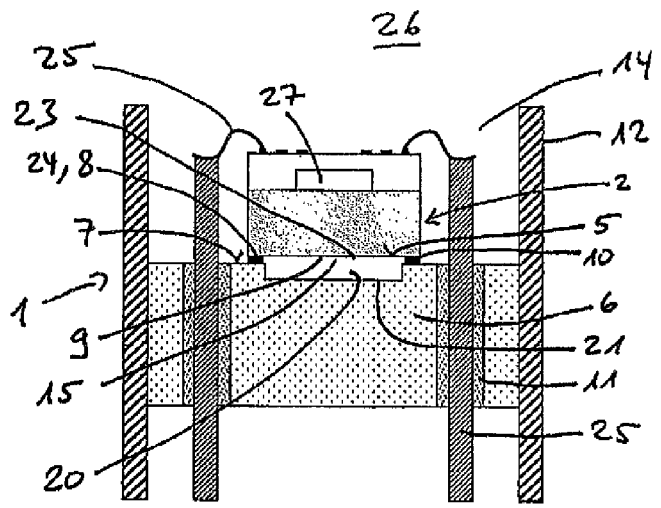
FIG. 7 a pressure sensor according to the invention.
Figure 2:
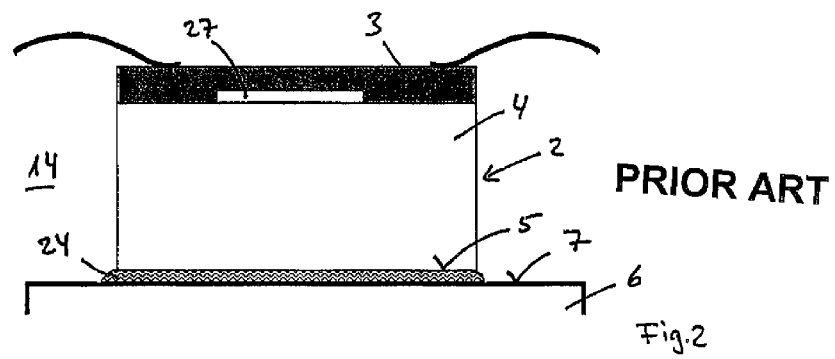
FIG. 2 a sensor chip element on a substrate with adhesion arrangement according to the prior art.
Figure 3A:
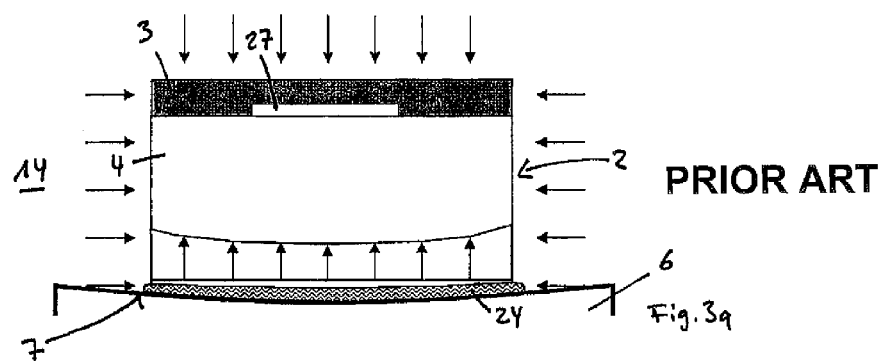
FIG. 3a a sensor chip element of prior art FIG. 2 under pressure load.
Figure 3B:
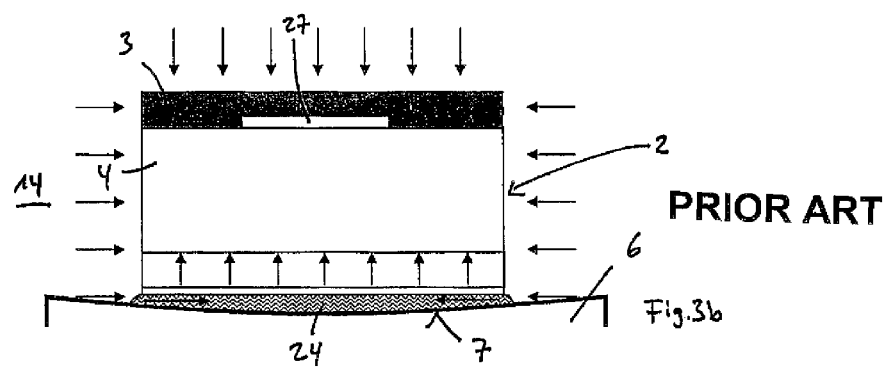
FIG. 3b a sensor chip element of prior art FIG. 2 under pressure load after a period of time.

Finally, FIG. 7 shows a pressure sensor 1 according to the invention with a recess 20, for example along a diagonal 23 of sensor chip element 2 as shown in FIG. 4c. It may be constructed as shown without a membrane 13 or, with a membrane 13 as represented in FIG. 1.

LIST OF REFERENCE SIGNS

1 Pressure sensor, Sensor
2 Sensor chip element, Element
3 Chip
4 Chip base
5 Element lower face, Lower face
6 Substrate, Passthrough
7 Substrate upper face
8 Adhesion area
9 Non-adhesion area
10 Outer edge of the lower face
11 Insulating element
12 Housing
13 Membrane
14 Pressure medium, Pressure chamber
15 Centrally located circular area
16 Communicating area
17 Sensor axis
18 Circular line, concentric with the sensor axis
19 Corner points of the lower face
20 Recess, Drillhole
21 Diameter of the recess or drillhole
22 Edge length of the element lower face
23 Diagonal of the element lower face
24 Adhesive substance
25 Contacts
26 Pressure chamber
27 Closed chip cavity

The invention claimed is:

1. A pressure sensor comprising:
   a piezoresistive sensor chip element having a closed chip cavity for measuring the pressure of a pressure medium flowing around the chip element, the chip element having an element lower face, and
   a substrate having a substrate upper face, to which the sensor chip element is fastened at the lower face thereof, wherein said lower face includes an adhesion area and has an outer edge, and wherein the lower face adheres to the substrate upper face in the adhesion area, wherein the lower face has a non-adhesion area that does not adhere to the substrate upper face and wherein the non-adhesion area extends at least over a circular area located centrally on the lower face, which circular area occupies a third of the total surface area of the element lower face, and wherein the non-adhesion area comprises at least one communicating area from the circular area to the edge of the lower face, so that the pressure in the pressure medium is able to spread through the communicating area into a space below the non-adhesion area on the element lower face, wherein the substrate has a recess located centrally below the sensor chip element.

2. The pressure sensor according to claim 1, wherein the recess is a drillhole.

3. The pressure sensor according to claim 1, that wherein the element lower face is rectangular and the diameter of the recess is greater than an edge length and smaller than a diagonal of the element lower face.

4. The pressure sensor according to claim 1, wherein the non-adhesion area occupies at least the area of the recess that is located opposite the element lower face.

5. The pressure sensor according to claim 1, wherein the recess extends at least over a circular area located centrally on the lower face, which circular area occupies a third of the total surface area of the element lower face, and wherein the recess comprises at least one communicating area from the circular area to the edge of lower face, so that the pressure in the pressure medium is able to spread through the communicating area into a space below the non-adhesion area on the element lower face.

6. The pressure sensor according to claim 1, wherein the adhesion area is applied in a substantially circular line that is concentric with a sensor axis.

7. The pressure sensor according to claim 1, wherein the adhesion area consists of discrete points or discrete segments.

8. The pressure sensor according to claim 1, wherein the adhesion area is attached at corner points of the lower face.

9. The pressure sensor according to claim 1, wherein the adhesion area occupies less than 20% of the element lower face in total.

10. The pressure sensor according to claim 1, wherein the sensor is a high pressure sensor, suitable for measuring pressures greater than 50 bar.

11. The pressure sensor according to claim 1, wherein the sensor chip element adheres to the substrate via an adhesive substance.

12. The pressure sensor according to claim 11, wherein the adhesive substance can sustain linear elongation of at least 100%.

* * * * *